US007409030B2

(12) United States Patent
Cheng

(10) Patent No.: US 7,409,030 B2
(45) Date of Patent: Aug. 5, 2008

(54) APPARATUS AND METHOD OF CLOCK RECOVERY FOR SAMPLING ANALOG SIGNALS

(75) Inventor: Kun-Nan Cheng, Hsinchu (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 701 days.

(21) Appl. No.: 10/401,900

(22) Filed: Mar. 28, 2003

(65) Prior Publication Data

US 2003/0185332 A1 Oct. 2, 2003

Related U.S. Application Data

(60) Provisional application No. 60/369,527, filed on Apr. 1, 2002.

(51) Int. Cl.
*H03D 3/24* (2006.01)
*H04L 7/00* (2006.01)

(52) U.S. Cl. ...................................... 375/376; 375/354

(58) Field of Classification Search ................. 375/226, 375/293, 240.2, 354, 359, 362, 365, 368, 375/371, 373, 375, 376, 276; 370/395.62, 370/503, 512, 516, 395, 376; 345/204
See application file for complete search history.

(56) References Cited

U.S. PATENT DOCUMENTS

| | | | | |
|---|---|---|---|---|
| 4,912,726 | A * | 3/1990 | Iwamatsu et al. | 375/294 |
| 5,742,649 | A * | 4/1998 | Muntz et al. | 375/371 |
| 5,847,701 | A * | 12/1998 | Eglit | 345/204 |
| 6,002,446 | A * | 12/1999 | Eglit | 348/581 |
| 6,243,034 | B1 * | 6/2001 | Regier | 341/166 |
| 6,326,961 | B1 * | 12/2001 | Lin et al. | 345/213 |
| 6,329,981 | B1 * | 12/2001 | Lin et al. | 345/204 |
| 6,643,346 | B1 * | 11/2003 | Pedrotti et al. | 375/375 |
| 6,819,730 | B2 * | 11/2004 | He | 375/376 |
| 6,826,247 | B1 * | 11/2004 | Elliott et al. | 375/376 |
| 2002/0044620 | A1 * | 4/2002 | Spijker et al. | 375/371 |
| 2003/0156655 | A1 * | 8/2003 | Hietala et al. | 375/293 |

* cited by examiner

*Primary Examiner*—Khai Tran
(74) *Attorney, Agent, or Firm*—J.C. Patents

(57) ABSTRACT

A clock and phase detect algorithm detects the best sample result for back-end system to recover the sample clock from front-end system. The algorithm of the present invention gets the sample result from ADC by applying slope variation sum (SPVS), which is used in turning points of sample result. The exact sample clock will always get the maximum SPVS value no matter how special or difficult the pattern is. It can detect not only most of normal patterns, but also the special patterns like block, linear piece pattern. The use of SPVS result allows back-end systems to distinguish which clock is the exact clock to sample the analog signal, and make the back-end convert quality is almost the same as the front-end. This function can be operated by system maker and maintain the quality of display automatically, no manual operation is need.

10 Claims, 5 Drawing Sheets

APPARATUS AND METHOD OF CLOCK RECOVERY FOR SAMPLING ANALOG SIGNALS

CROSS-REFERENCE TO RELATED APPLICATION

This application claims the priority benefit of U.S. provisional application titled "PHASE DETECT ALGORITHM USING FIRST ORDER SLOPE FOR CLOCK RE-GENERATION" filed on Apr. 1, 2002, Ser. No. 60/369,527.

BACKGROUND OF THE INVENTION

1. Field of the Invention

The present invention generally relates to signals processing technology in the application of display systems. More particular, the present invention relates to an apparatus and method of clock recovery for sampling analog signals provided to an analog-to-digital converter (ADC).

2. Description of Related Art

Digital image processing is the most popular method used in display system. However, the drawback of digital signal processing is the use of high bit counts while digital signals are transmitted between different systems. In addition, a great deal of bandwidth and processing power are required for data transfer therebetween. Therefore, the use of analog signals is the prime solution in the application of data transmission between different system interfaces. For example, eight data lines are required for the transmission of a 8-bit digital pixel signal of 256 colors, while one data line provided for the transmission of analog signal is sufficient. Accordingly, the digital-to-analog converter (DAC) and the analog-to-digital converter (ADC) have become the most important components for connecting two digital systems. For example, digital pixel data are generated by a graphics chip and converted by the DAC into the associated analog pixel signals in a computer. The analog pixel signals are transmitted, through a cable, to the ADC of a back-end digital display device. The ADC receives the analog pixel signals and converts them into the associated digital pixel signals for image display. In other words, the ADC is used to generate the digital pixel signals corresponding to the digital pixel data.

The analog pixel signals coming from a graphics system, such as a personal computer (PC), are generated in synchronization with an internal clock thereof. Therefore, it is required to provide a sample clock with substantially the same frequency as that of the internal clock for analog signal processing at the back-end display device. The quality of the image to be displayed on the back-end display is heavily relied upon whether the analog pixel signals are in synchronization with the sample clock.

However, in the personal computer, no such sample clock will be so provided that the sample clock should be recovered from a reference signal, such as a horizontal synchronization signal, hereinafter Hsync. The Hsync signal is provided with a time period which is Htt times the pixel clock period, wherein Htt designates the horizontal total pixel counts for each line. Accordingly, the recovered clock should have a frequency of (Hsync frequency)×(Htt). However, Htt usually varies with different display modes or even different graphic chips while performing at the same display mode. Therefore, mode detection is needed to assist the display device to estimate the value of Htt. Conventionally, the mode detection uses a clock with a fixed frequency to count the Hsync signal and to generate a count value. The count value can be employed to look up the VESA (Video Electronic Standards Association) standard table so as to obtain the possible display mode (XGA, SVGA, etc.). But the conventional method cannot calculate the exact Htt because the clock with the fixed frequency is unrelated to the sample clock used by the back-end display device.

In addition, phase detection algorithm can be used for sample clock recovery devicey by means of generating an estimated value of Htt and then using the estimated value to approach the exact one. A sum of $\Sigma|\text{pixel}(n)-\text{pixel}(n+1)|$ is a simple way to implement the phase detection algorithm. However, the pixel difference method is useful for most kinds of patterns, but unfavorable for special patterns like block pattern, linear piece pattern, or the like. Moreover, the use of $\Sigma|\text{pixel}(n)-\text{pixel}(n+1)|$ cannot identify incorrect maxima and slope change.

SUMMARY OF THE INVENTION

The present invention is a first-order-slope phase detect algorithm for deducting the exact clock and phase. Analog signal is basically a wave in the time domain, therefore the clock and phase problem can be solved in the mathematical way. For any curve f(x), the derivative of the curve f(x) in respect to time is f'(x), and f'(x)=0 represents a local minimum or maximum. The local minima or maxima in the curve must be some of the correct sample points. The phase detect algorithm of the present invention is used to find the local minimum or maximum points. We induce a slope polarity variation sum SPVS to indicate whether all local minimum and maximum points are actual parts of the sample points when a clock and phase is applied. The result of correct sample clock will sample all local minimum and maximum points that have maximum SPVS result because of curve transition f'(x)=0. As a result, the SPVS value can accurately find the correct sample clock for an ADC. If all local minimum and maximum points are in the sets of sample points, the total sum of SPVS will be the maximum. Also, the concept of turning points, where the slope of the line changes from either positive or negative to zero, is introduced and applied to enhance the method of the present invention for special linear piece patterns to make sure that no false result will be induced during processing the SPVS. The present invention can detect all kinds of patterns includes the special pattern likes block, linear piece, and so on.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
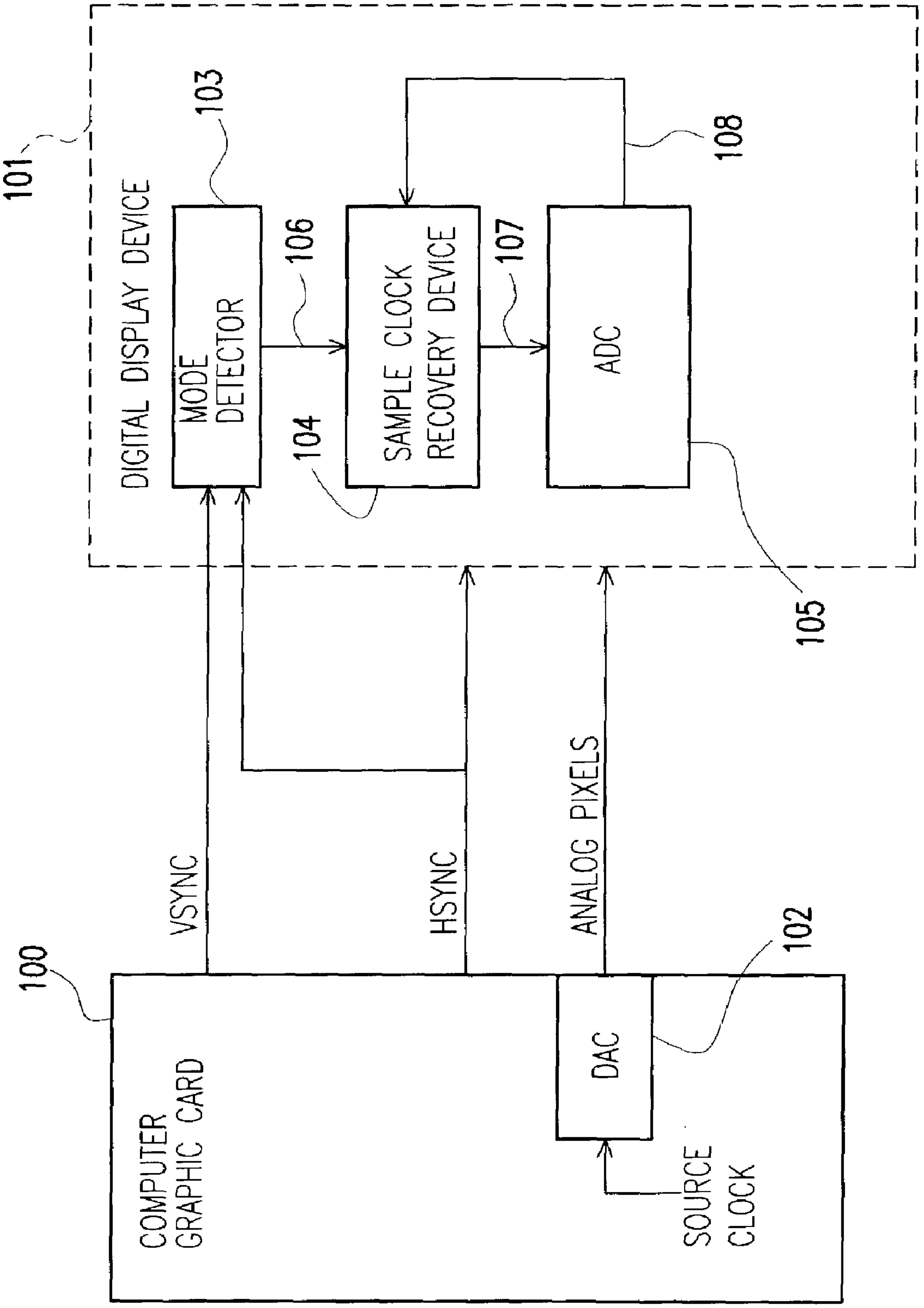
FIG. 1 is a schematic diagram of a computer display system according to a preferred embodiment of the present invention.

FIG. 1 shows a computer display system. A computer graphic card 100 generates Hsync, Vsync and pixel signals according to a source clock. A digital-to-analog converter (DAC) 102 is employed to convert digital pixels data into analog pixel signals. A digital display device 101 receives Hsync, Vsync, and the analog pixel signals through a cable connected to the computer graphic card 100. A mode detector 103 uses a clock having a fixed frequency to count the Hsync and Vsync signals so as to obtain a total horizontal pixel number Htt and a total vertical line number Vtt. By referring to the VESA standard table, a rough Htt 106 along with a display mode can be therefore generated in accordance with the counted Htt. The rough Htt 106 is fed to the sample clock recovery device 104 to generate a reference clock signal 107 to an ADC 105 for sampling the analog pixel signals. The digital output of the ADC 105 is then fed into sample clock recovery device 104 to determine whether the sample data 108 are correct or not. If the sample data 108 are incorrect, the sample clock recovery device 104 adjusts the period and phase of the clock signal 107 to sample the analog pixel signals again. Such feedback processing continues again until the sample data are correct.

Figure 2:
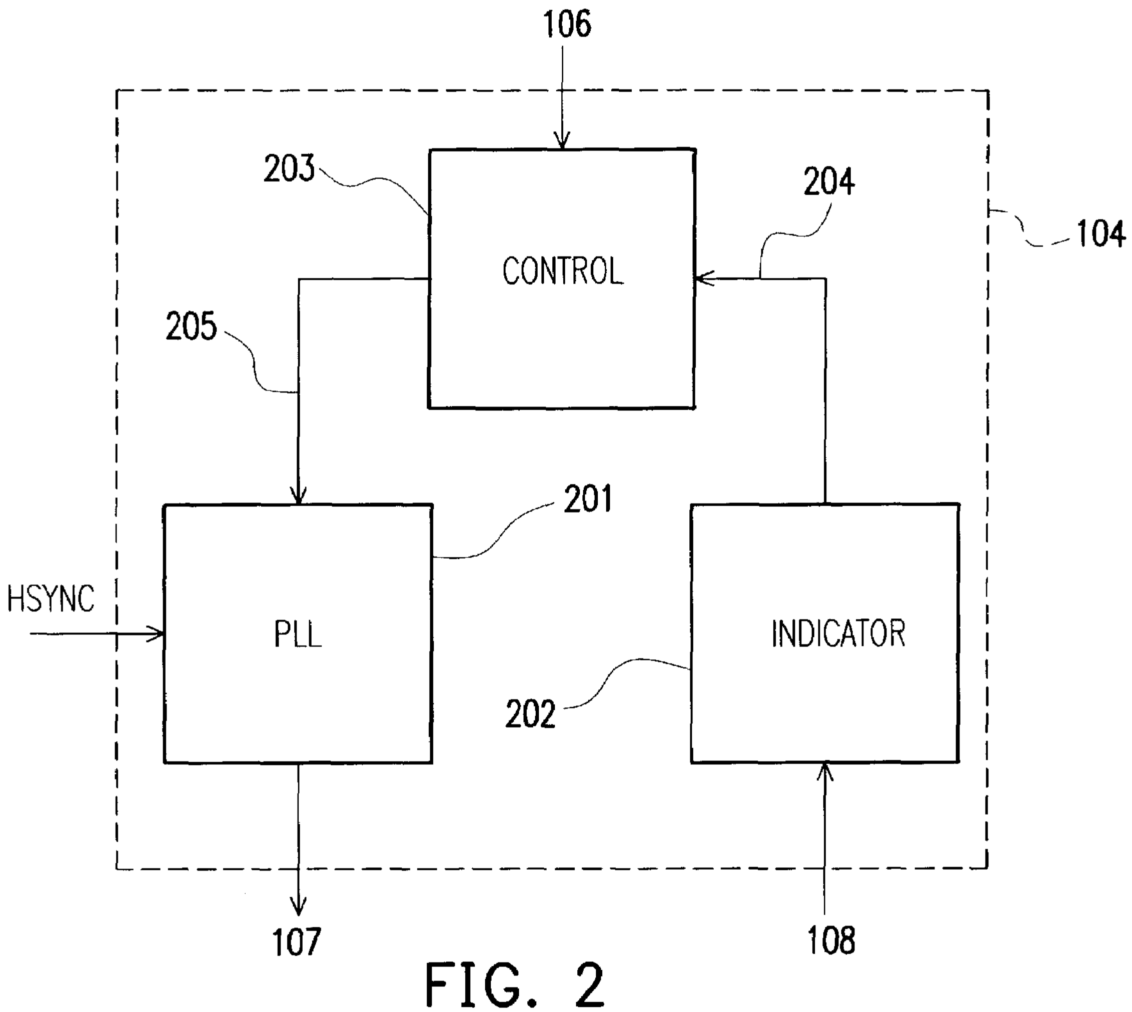
FIG. 2 is a detail block diagram of sample clock recovery device according to a preferred embodiment of the present invention.

FIG. 2 is a detailed block diagram of the sample clock recovery device 104. As shown in FIG. 2, the sample clock recovery device 104 has a phase-locked loop (PLL) 201, an indicator 202, and a control 203. The phase-locked loop 201 is used to lock the Hsync signal with a frequency of FIN and generate the clock signal 107 with a frequency of FOUT by the ratio FOUT=FIN×M/N, wherein M and N are integers. The indicator 202 is used to determine, responsive to the sample data 108, whether the sample data 108 are prefect and to issue a detection result 204, accordingly. If the the sample data 108 is detected by the indicator 202 to be incorrect, the detection result 204 associated therewith is transmitted and sent to the control 203 so as to generate new values of M' and N' via an output line 205. The phase-locked loop 201 receives the M' and N', and regenerates the clock signal 107 with another frequency FOUT' of (FIN×M'/N'), accordingly. The clock signal 107 with FOUT' is thereafter provide for the ADC 105 to sample the analog pixel signals again. As mentioned above, the regeneration/re-sampling feedback processing continues until the sample data 108 are determined to be correct.

Figure 3:
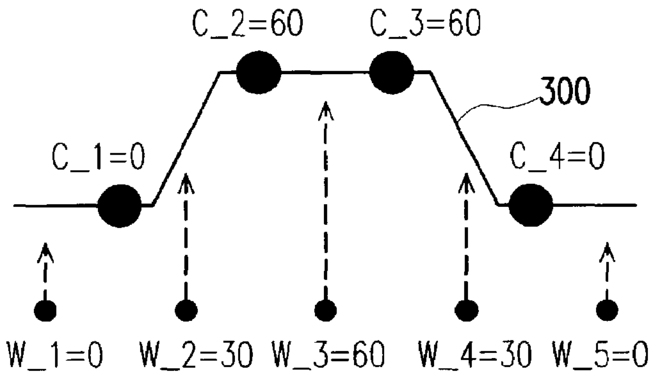
FIG. 3 is an analog pixel signal having a block pattern.

FIG. 3 depicts the analog pixel signal having a block pattern 300. The block pattern may occur while two or more pixels are provided with the same level. When two different sample clocks C and W are applied to the block pattern 300, as referring to in FIGS. 4 and 5, the sample data are described as follows:

Sample clock C: C_1=0, C_2=60, C_3=60, and C_4=0

Sample clock W: W_1=0, W_2=30, W_3=60, W_4=30, and W_5=0

Figure 4:
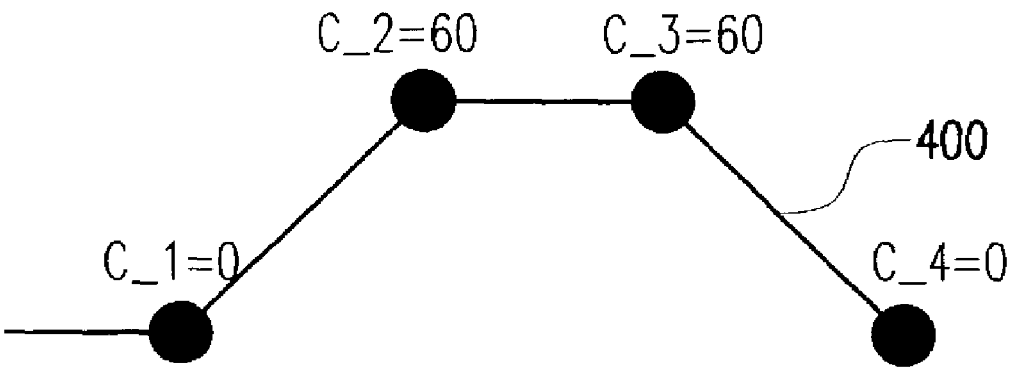
FIG. 4 is a curve by sampling the analog pixel signal of FIG. 3 according to a sample clock C.
Figure 5:
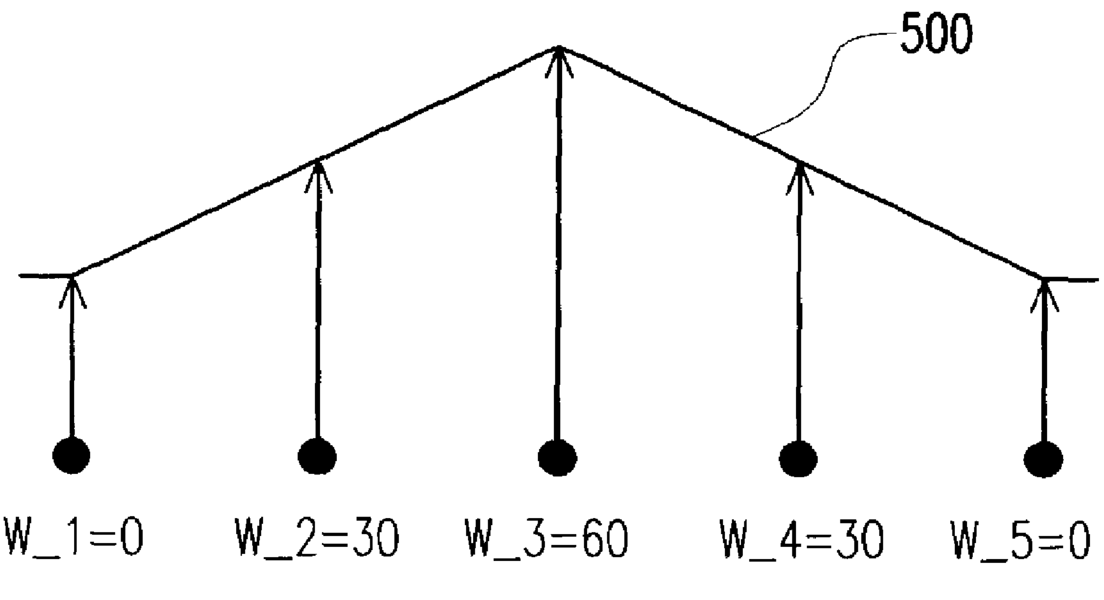
FIG. 5 is a curve by sampling the analog pixel signal of FIG. 3 according to a sample clock W.

FIG. 4 shows a fitting curve 400 by sampling the block pattern 300 in accordance with the sample clock C. Thus, the result by using the conventional pixel difference method=|C_1−C_2|+|C_2−C_3|+|C_3−C_4|=60+0+=120. FIG. 5 shows a fitting curve 500 by sampling the block pattern 300 in accordance with the sample clock W. The result by using the conventional pixel difference method=|W_1−W_2|+|W_2−W_3|+|W_3−W_4|+|W_4−W_5|=30+30+=120. As shown in FIGS. 4 and 5, even though the curve 400 should be better than the curve 500, the conventional pixel difference method cannot differentiate between them.

Figure 6:
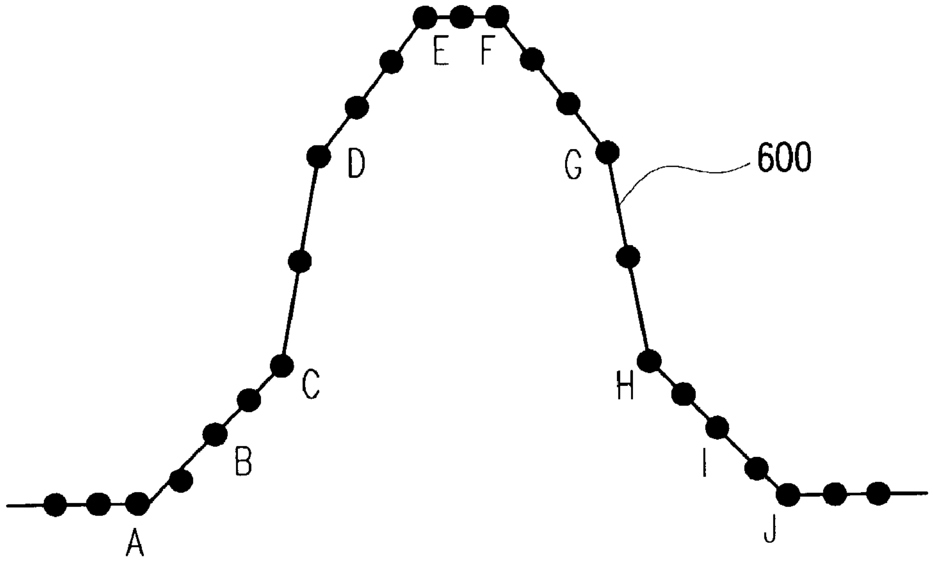
FIG. 6 is an analog pixel signal having a linear piece pattern.

FIG. 6 shows the analog pixel signal having a linear piece pattern 600. For the same reason, the conventional pixel difference method cannot differentiate the sample clock provided with better sample data from another sample clock with worse sample data, while both are applied to the linear piece pattern 600.

According to the present invention, a slope-change approach is employed. For a continuous curve f(x), the slope f'(x) is defined to be a "limit point" indicator. If f'(x)=0, x represents a local minimum or maximum point which is designated to be a limit point). The limit point has a slope polarity changing from "positive" to "negative," or from "negative" to "positive". By taking the linear piece pattern 600 of FIG. 6 as an example, the slope polarity at the sample point B, C, D, G, H, or I is changed from "positive" to "positive, or from "negative" to "negative". Owing to occurrence of the limit point, the slope polarity at the sample point A, E, F, or J is changed from "zero" to "positive", from "positive" to zero, from "zero" to "negative," or from "negative" to "zero". The point A, E, F, or J is defined to be "a turning point" in accordance with the present invention. The turning points are characterized in that those points are provided with slope polarity change. The more the sample point closes to the turning point, the more the slope polarity changes.

Figure 7:
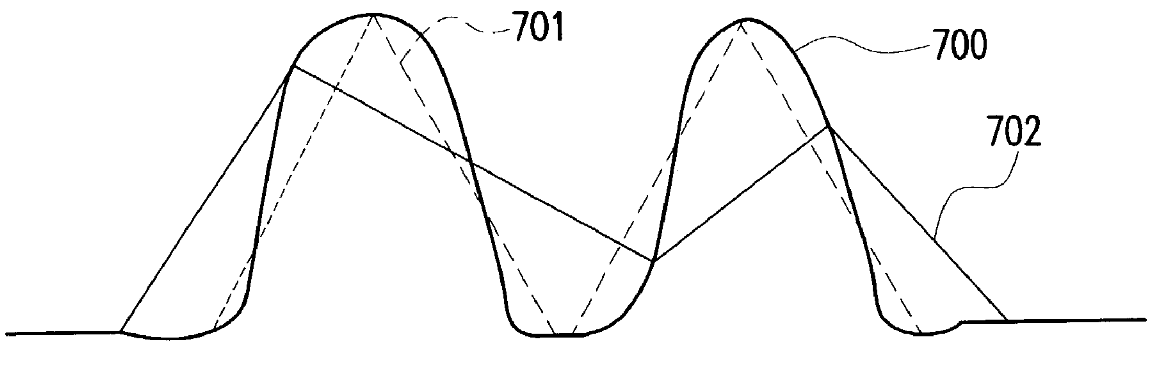
FIG. 7 is a drawing for explaining the concept of present invention.

FIG. 7 shows a drawing for explaining the concept of present invention. According to the present invention, if the sample points located at the turning points the maximum slope-polarity-variation-sum (SPVS) can be obtained as compared to those far away from the turning points. The curve 700 is an analog signal, the curve 701 is the one that the sample points hit the turning points, and the curve 702 is the one that the sample points miss the turning points. The SPVS of the curve 701 is greater than that of the curve 702. Accordingly, the value of SPVS is employed to generate the optimum sample clock.

Figure 8:
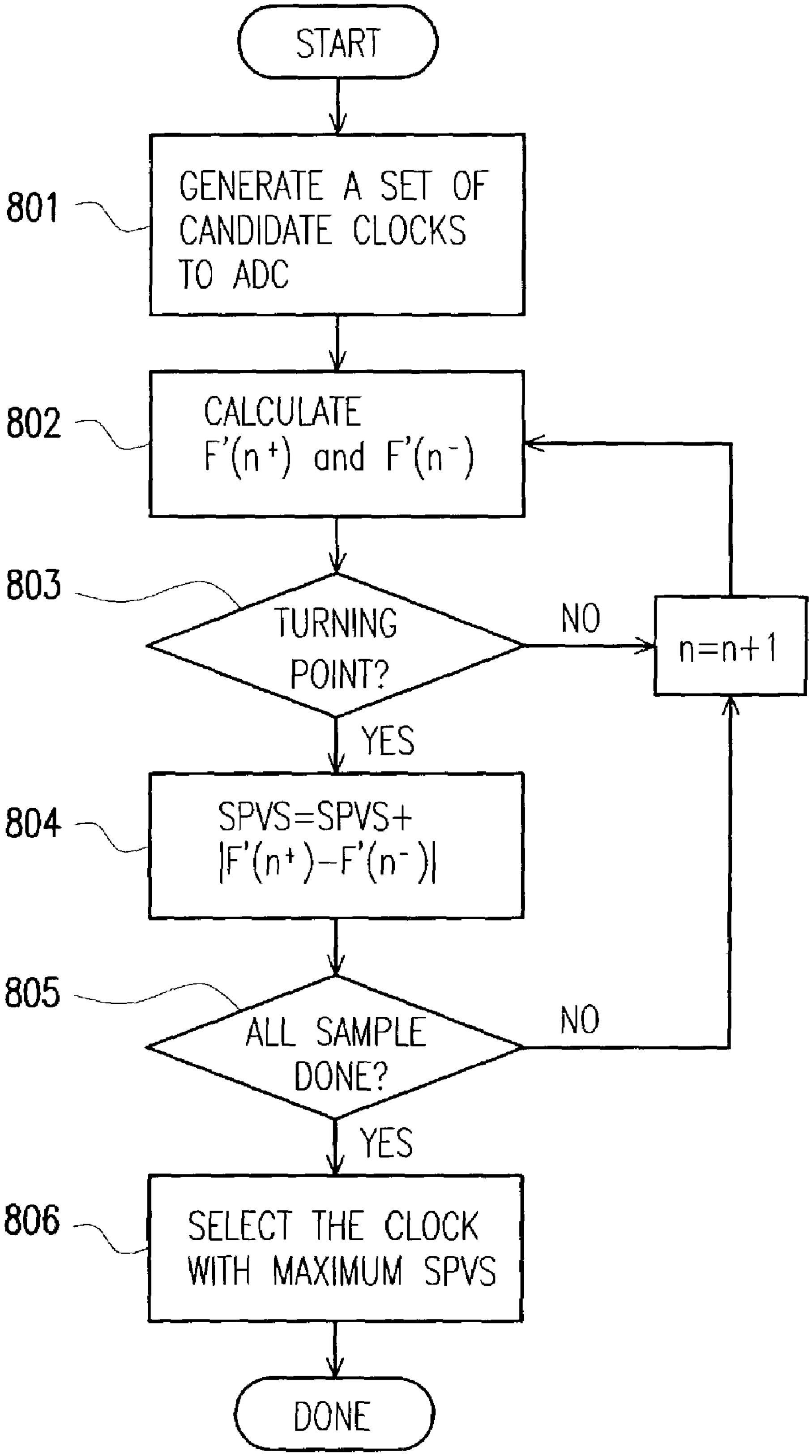
FIG. 8 is the flow chart according to one preferred embodiment of the present invention.

FIG. 8 shows the flow chart of the SPVS method in accordance with one preferred embodiment of the present invention. The SPVS method of the present invention will be described step-by-step as follows:

(1) Step 801: Initially, SPVS is reset to be zero. Based on the estimated Htt 106 generated by the mode detector 103, a set of the candidate clock signals is fed to the ADC 105. The sample data in response to different candidate clock signals are generated by the ADC 105.

(2) Step 802: $F'(n^+)=F(n+1)-F(n)$ and $F'(n^-)=F(n)-F(n-1)$ are defined and calculated for a sample point n, wherein F(n−1), F(n), and F(n+1) represent the sample data.

(3) Step 803: If $F'(n^+)$ and $F'(n^-)$ has no polarity change, that is, from "positive" $F'(n^-)$ to "positive" $F'(n^+)$ or from "negative $F'(n^-)$ to negative $F'(n^+)$," F(n) is determined not to be a turning point. After n is incremented by one, the flow goes back to Step 802. Otherwise, if the polarities of $F'(n^-)$ and $F'(n^+)$ are changed from "positive" to "negative," from "positive" to zero, from zero to "positive," from "negative" to "positive," from "negative" to zero, or from zero to "negative," the flow goes to Step 804. Where n=discrete sample points $$n^+=X>n,\ X\approx n$$

$$n^-=X<n,\ X\approx n$$

(4) Step 804: the SPVS is accumulated according to Equation (1):

$$SPVS=SPVS+|F'(n^+)-F(n^-)|=|F(n+1)+F(n-1)-2F(n)| \quad (1)$$

(5) Step 805: By following Step 804, the flow goes to Step 805 to check whether all sample points has been done. If no, the flow goes back to Step 802 after n is incremented by one. If yes, the flow goes to Step 806.

(6) Step 806: By comparing the SPVS values, the sample clock having the maximum SPVS is selected for sampling the analog pixel signals.

If the SPVS method of the present invention is applied to the block pattern of FIG. 3, Clock C: C_1=0, C_2=60, C_3=60, C_4=0;

Clock W: W_1=0, W_2=30, W_3=60,W_4=30, W_5=0.

For clock C:

Turning points: C_1, C_2, C_3, and C_4

$$\begin{aligned} SPVS &= |F'(C\_1^+) - F'(C\_1^-)| + |F'(C\_2^+) - F'(C\_2^-)| + |F'(C\_3^+) - F'(C\_3^-)| + |F'(C\_4^+) \\ &\quad - F'(C\_4^-)| \\ &= |C\_0 + C\_2 - 2C\_1| + |C\_1 + C\_3 - 2C\_2| + |C\_2 + C\_4 - 2C\_3| + |C\_3 + C\_5 - 2C\_4| \\ &= 60 + 60 + 60 + 60 \\ &= 240 \end{aligned}$$

For clock W:

Turning points: W_1, W_3, W_5

$$\begin{aligned} SPVS &= |F'(W\_1^+) - F'(W\_1^-)| + |F'(W\_3^+) - F'(W\_3^-)| + |F'(W\_5^+) - F'(W\_5^-)| \\ &= |W\_0 + W\_2 - 2W\_1| + |W\_2 + W\_4 - 2W\_3)| + |W\_4 + W\_6 - 2W\_5| \\ &= 30 + 60 + 30 \\ &= 120 \end{aligned}$$

According to the SPVS method of the present invention, the sample clock C, but not the sample clock W, is selected to correctly sample the analog pixel signals due to its greater SPVS. The method of the present invention can accurately and easily calculate the correct sample clock for the ADC 105 whereby greatly enhancing image quality and sharpness.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus to recover an optimized clock signal by sampling an analog signal with a synchronization signal, said apparatus comprising:

a mode detector for generating a detected value in response to said synchronization signal;

a clock recovery device for generating a clock signal in response to said detected value; and an analog-to-digital converter for sampling said analog signal in response to said clock signal and generating sample data;

wherein said sample data having at least one turning point n occurring in said sample data subject to a slope polarity change are fed to said clock recovery device for determining whether said sample data are either desirable or undesirable, which is indicated by a detection result according to a sum value of said slope polarity change of said at least one turning point n, and said sum value is defined to be $\Sigma|f'(n+)-f'(n-)|$ in said sample data for all of said at least one turning point n, where $f'(n+)=f(n+1)-f(n)$, $f'(n-)=f(n)-f(n-1)$, and all of f(n+1), f(n), f(n-1) are selected from said sample data;

wherein said clock recovery device regenerates the clock signal to said analog-to-digital converter if said sample data is undesirable, so as to optimize the clock signal.

2. The apparatus as claimed in claim 1, wherein said clock recovery device comprises:

a control for generating a control value in response to said detected value;

a phase-locked loop for generating said clock signal in response to said control value; and an indicator for generating said detection result to indicate whether said sample data are either desirable or undesirable in response to said sample data;

wherein said control updates said control value in response to said undesirable sample data, and thereafter said phase-locked loop regenerates said another clock signal in response to said updated control value.

3. The apparatus as claimed in claim 2, wherein said indicator generates said detection result by calculating said sum value of said slope polarity change at said at least one turning point n.

4. The apparatus as claimed in claim 3, wherein, near said at least one turning point n, from n− to n+ is subject to said slope polarity change consisting of "+" to "−", "+" to "0", "0" to "+", "−" to "+", "−" to "0", and "0" to "−".

5. The apparatus as claimed in claim 1, said sum value of said desirable clock signal should be maximized.

6. A method to recover an optimized clock signal by sampling an analog signal with a synchronization signal, said method comprising the following steps of:

generating a detected value in response to said synchronization signal;

generating a clock signal in response to said detected value;

sampling said analog signal in response to said clock signal so as to generate sample data, wherein said sample data has at least one turning point n subject to a slope polarity change;

determining whether said sample data are either desirable or undesirable in response to said slope polarity change; and regenerating the clock signal if said sample data is undesirable, so as to optimize the clock signal, wherein whether said sample data are desirable or undesirable is indicated by a detection result according to a sum value of said slope polarity change of said at least one turning pointn, and said sum value is defined to be $\Sigma|f'(n+)-f'(n-)|$ in said sample data for all of said at least one turning point n, where $f'(n+)=f(n+1)-f(n)$, $f'(n-)=f(n)-f(n-1)$, and all of $f(n+1)$, $f(n)$, $f(n-1)$ are selected from said sample data.

7. The method as claimed in claim 6, further comprising:

generating a control value in response to said detected value;

generating said clock signal in response to said control value;

generating said detection result to indicate whether said sample data are either desirable or undesirable in response to said sample data;

updating said control value in response to said undesirable sample data; and regenerating said another clock signal in response to said updated control value.

8. The method as claimed in claim 7, wherein the step of generating said detection result is implemented by calculating said sum value of said slope polarity change at said at least one turning point n.

9. The method as claimed in claim 8, wherein, near said at least one turning point n, from n− to n+ is subject to said slope polarity change consisting of "+" to "−", "+" to "0", "0" to "+", "−" to "+", "−" to "0", and "0" to "−".

10. The apparatus as claimed in claim 7, wherein said sum value of said desirable clock signal should be maximized.

* * * * *